United States Patent [19]

Hileman et al.

[11] Patent Number: 5,259,783

[45] Date of Patent: Nov. 9, 1993

[54] DUAL HEIGHT CARD RETAINER

[75] Inventors: Vince Hileman, San Jose; Steven J. Furuta, Santa Clara; Clifford B. Willis, Tracy; Robert J. Lajara, San Jose, all of Calif.

[73] Assignee: Sun Microsystems, Inc., Mountain View, Calif.

[21] Appl. No.: 884,518

[22] Filed: May 15, 1992

[51] Int. Cl.$^5$ .................... H01R 13/62; H01R 23/68
[52] U.S. Cl. .................... 439/372; 439/368; 439/74; 361/785; 211/41
[58] Field of Search .............. 439/372, 368, 157, 153, 439/160, 74; 211/41; 361/412, 413

[56] References Cited

U.S. PATENT DOCUMENTS 3,853,379 12/1974 Goodman et al. .................. 439/372

Primary Examiner—Gary F. Paumen
Attorney, Agent, or Firm—Blakely Sokoloff Taylor & Zafman

[57] ABSTRACT

An easy to engage and disengage dual height card retainer that facilitates removal of daughterboards is disclosed. Daughterboards have a two-tier staggered arrangement above the motherboard. Each daughterboard has a signal transfer end that electrically connects to the motherboard through one of the dual height bus connectors, and a back panel connector end that couples to the back panel with an accessory connector or with a filler panel that functions as an electromagnetic interference shield. Dual height card retainers that require no tools to operate function as retaining means to prevent daughterboards from working lose from bus connectors during shipment.

19 Claims, 3 Drawing Sheets

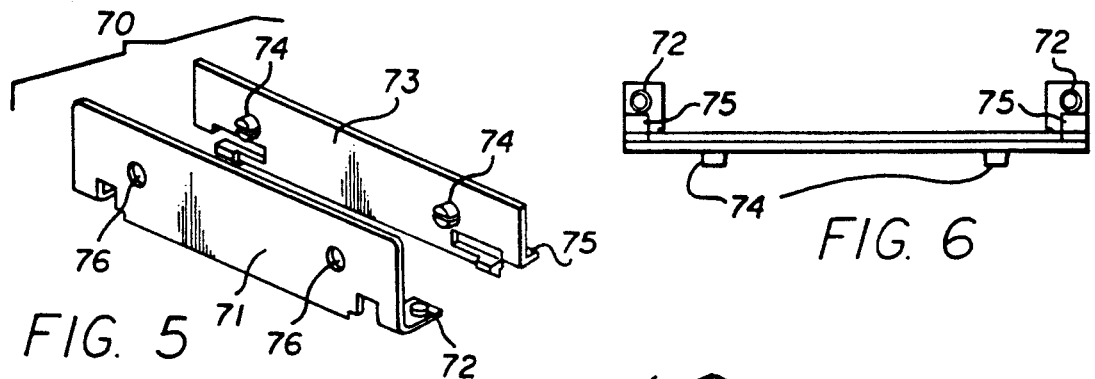
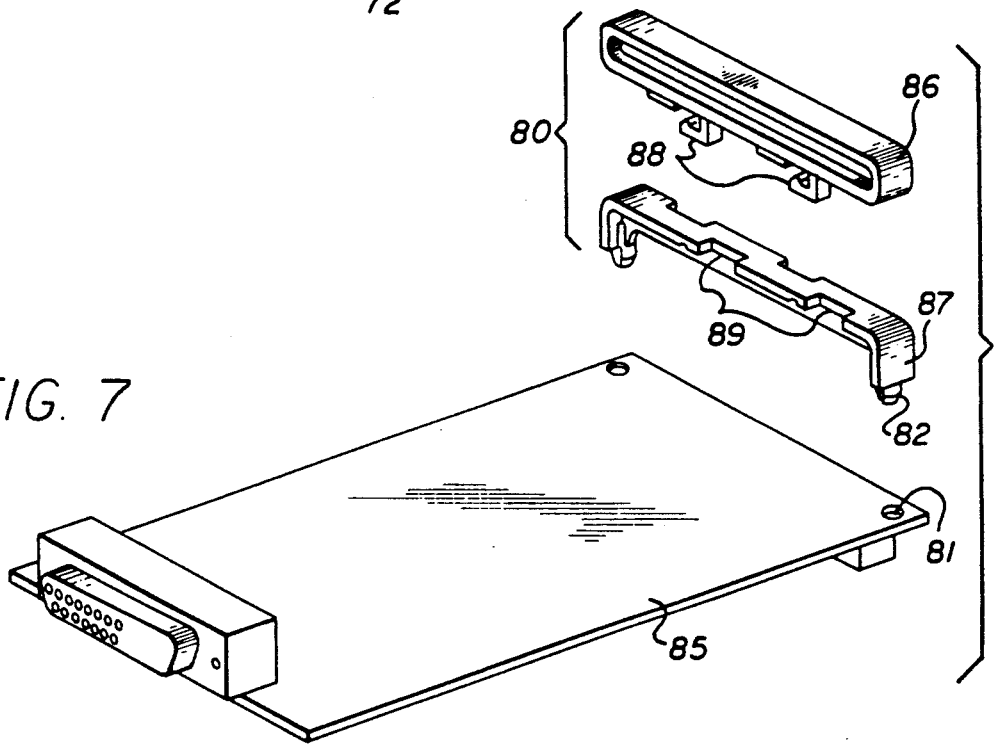
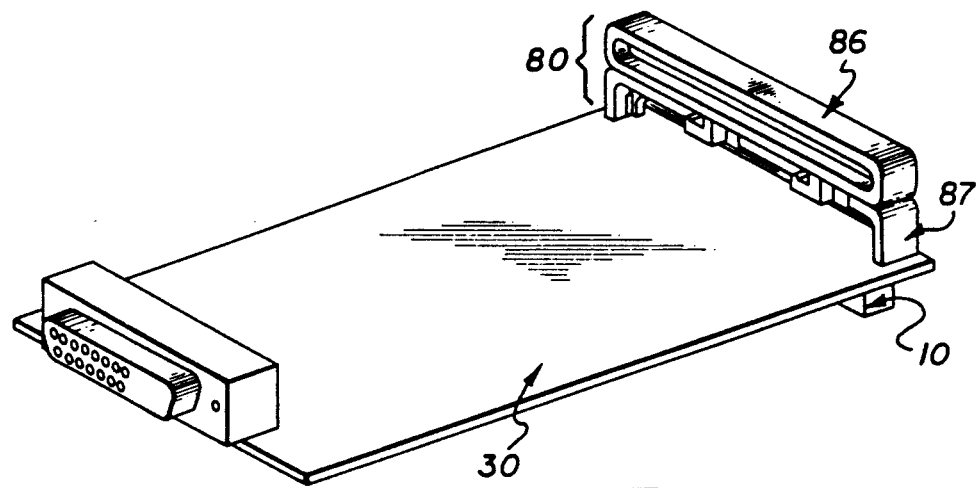

DUAL HEIGHT CARD RETAINER

BACKGROUND OF THE INVENTION

1. Field of the Invention

This invention relates to the field of data processing systems. In particular, this invention relates to the placement of circuit board modules in data processing systems.

2. Art Background

In recent years manufacturers of data processing systems have strived to design and package systems to be compact and easy to service and upgrade at the end user site. Compact designs are desirable because they are easily utilized in an office environment where the availability of space and special environmental conditions required by mainframe computers is limited. In addition, data processing systems are typically marketed with a number of options available. The end user may wish to add or remove options at any time after initial installation. It is desirable that the field service representative or end user be able to easily make changes in the field in the minimum time possible without the need for special tools.

A common method of achieving the goals of compact design and ease of field service and field upgrades is to employ a modular circuit board design. A common type of modular design provides for a main circuit board which may be referred to as the "motherboard". The motherboard usually contains the basic computer circuitry essential for operation of the data processing system. One or more additional circuit boards are used to provide optional or enhanced functions. The circuit boards containing circuitry necessary to accomplish the optional functions can be referred to as "daughterboards". Daughterboards can be electrically connected to the motherboard over multi-pin bus connectors.

As an example, a daughterboard may serve as an interface to an optional printing device for the data processing system. In a modular system, the optional printing device can be added at the end user site by adding the printer interface module as a daughterboard to the data processing system. The printer interface daughterboard can be coupled to the motherboard over a multi-pin bus connector to provide data and control for the printer. The printer daughterboard may have a printer connector attached or may have a cable that can be routed to an accessory panel that provides the printer connector.

Some modular designs position daughterboards side by side above and parallel to the motherboard. This configuration in some circumstances can limit the speed of data transfer between motherboard and daughterboard. For example, memory expansion of a data processing system may require the use of more than one daughterboard. Side by side placement of daughterboards can complicate routing of motherboard bus signal traces that carry bus signals to the daughterboard connectors. This results in increased length of signal traces on the motherboard and a consequential limitation of data transfer speed. Moreover, closely spaced side-by-side daughterboards are difficult to properly remove by hand because of the difficulty of getting a grip on the daughterboard. In addition, daughterboards can work loose from the motherboard bus connectors during shipment, creating the need for means to retain the daughterboards onto the bus connectors. Past means for retaining the daughterboards have involved the use of screws or spring clips. However, these types of retaining means complicate the installation and removal of daughterboards in the field because of their need for special tools. Further, removal of spring clips of fasteners necessarily requires use of one or both hands of the person installing or removing daughterboards, thereby requiring another person, or alternatively a special tool, to manipulate the daughterboard.

As will be more fully described in the following detailed description, the present invention permits flexible placement of modular circuit boards in order to provide for minimal bus signal path lengths, and to provide for ease of installation and removal of circuit boards.

SUMMARY OF THE INVENTION

A modular circuit board placement system is disclosed that provides for flexibility in the placement of daughterboards, for minimal bus signal path lengths from the daughterboards the motherboard, and for ease of installation and removal of daughterboards. These goals are accomplished through the use of dual height bus connectors between the motherboard and the daughterboards and the use of a stepped back panel, resulting in a two-tier staggered arrangement of daughterboards above the motherboard. Further, the placement system provides for easy to engage and disengage dual height card retainers to hold daughterboards onto bus connectors, filler panels that function as module mounts, and multi-purpose circuit card handles that allow installation and removal of daughterboards without the need for special tools.

Each daughterboard has a signal transfer end that electrically connects to the motherboard and a back panel connector end that couples to the back panel. All daughterboards of the present invention have equal length from the signal transfer end to the back panel connector end in accordance with a published standard. A daughterboard may be single wide, double wide or triple wide. The preferred embodiment of the present invention can accommodate single wide, double wide, and triple wide daughterboards in many arrangements.

The stepped back panel of the placement system provides mechanical coupling and accessory connector openings for both tiers of daughterboards. The stepped back panel is arranged in a step fashion, having a lower portion for coupling to the lower tier of daughterboards and an upper portion for coupling to the upper tier of daughterboards. The back panel provides accessory connector openings for daughterboards that require electrical connection to an external device.

Multiple sets of single height and double height bus connectors are located on the motherboard. Each single height bus connector is equidistant from the back panel lower portion. Each double height bus connector is equidistant from the back panel upper portion. The signal transfer ends of lower and upper tier daughterboards are connected to the motherboard through single and double height bus connectors which provide for electrical connection between motherboard and the lower and upper tier daughterboards, and which prevent side to side movement of the daughterboards. The back panel connector ends of the lower and upper tier daughterboards are coupled to the lower and upper portions of the back panel, respectively.

Coupled to the back panel may be an accessory connector coupling to provide electrical connection to an external device and to secure the upper and lower tier daughterboards to the back panel. Alternatively, a filler panel may be used to serve the dual functions of securing the upper or lower tier daughterboard to the back panel and filling the corresponding accessory opening in the back panel to provide for electromagnetic interference shielding.

Dual height card retainers function as daughterboard retaining means to prevent daughterboards from working lose from bus connectors during shipment. No tools are required to engage and disengage the retaining means from the daughterboards. Multi-purpose circuit card handles are employed to facilitate installation and removal of daughterboards during field upgrade or field service. Each circuit card handle has a lower portion that remains attached to a daughterboard during normal system operation. Each circuit card handle has an optional upper portion that snaps on to the lower portion to function as a card retainer in systems having only one tier of daughterboards.

BRIEF DESCRIPTION OF THE DRAWINGS

FIG. 5 illustrates the filler panel which also serves to mechanically couple daughterboards to the back panel.

FIG. 6 shows a top view of the filler panel.

FIG. 7 illustrates the component parts of the multi-purpose circuit card handle and its coupling to a daughterboard.

FIG. 8 shows the multi-purpose circuit card handle coupled to a daughterboard to serve as retaining means for a system having only one tier of daughterboards.

DETAILED DESCRIPTION OF THE INVENTION

The modular circuit board placement system disclosed in the present invention provides for flexibility in the placement of daughterboards so as to minimize signal trace path lengths from the daughterboards the motherboard. In the following description for purposes of explanation, numerous details are set forth such as specific mechanical components, component connections, circuit paths, etc., in order to provide a thorough understanding of the present invention. However, it will be apparent to one skilled in the art that these specific details are not required to practice the present invention. In other instances well known mechanical structures and components are shown in order not to obscure the present invention unnecessarily.

The present modular circuit board placement system uses dual height bus connectors between the motherboard and the daughterboards and a stepped back panel, resulting in a two-tier staggered arrangement of daughterboards above the motherboard. The placement system also provides for ease of installation and removal of daughterboards through the use of easy to engage and disengage dual height card retainers that hold daughterboards onto bus connectors, filler panels that also function as module mounts, and multi-purpose circuit card handles that facilitate installation and removal of daughterboards.

Figure 1:
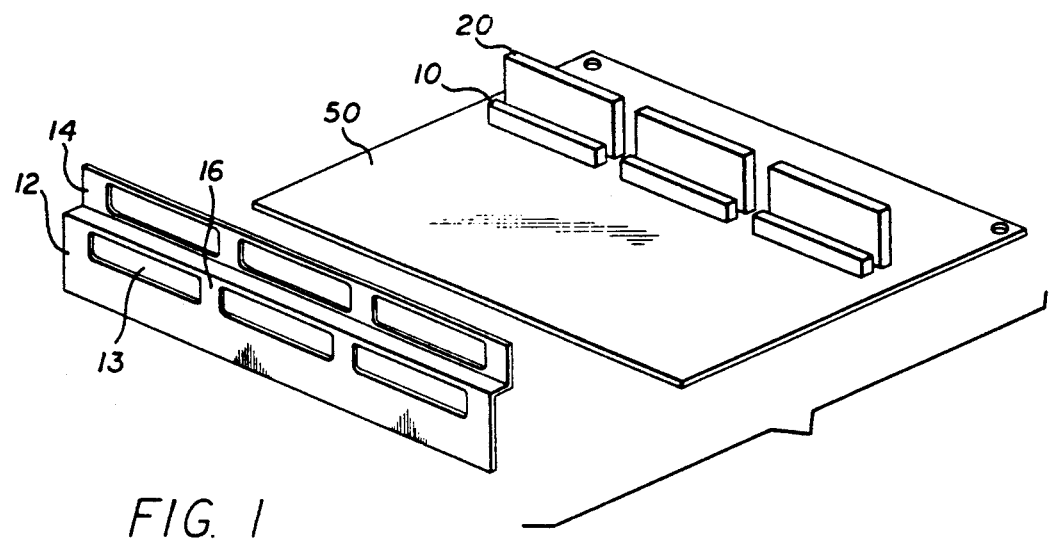
FIG. 1 illustrates the location of the dual height bus connectors on the motherboard and the step design of the back panel.
Figure 2:
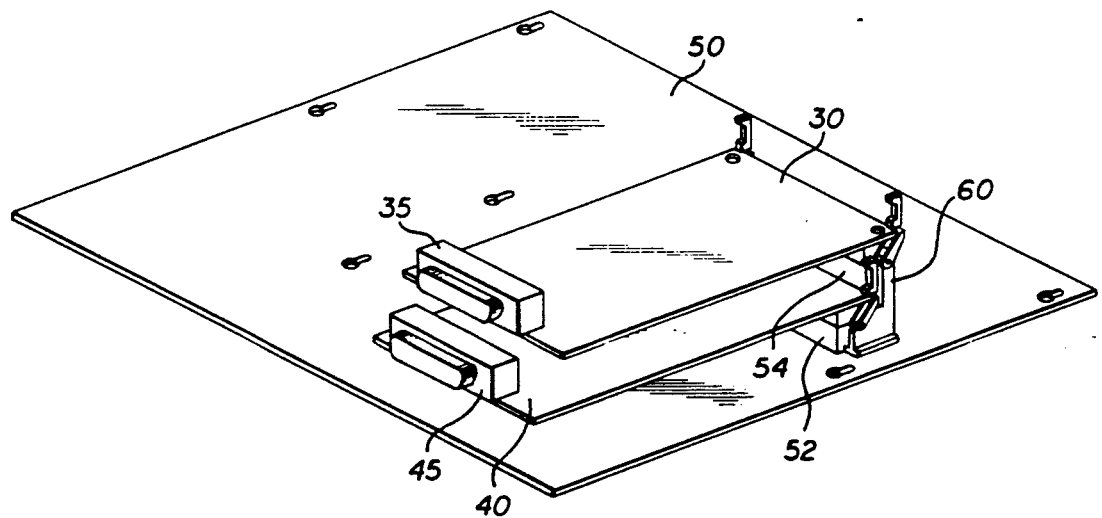
FIG. 2 illustrates the two-tier staggered arrangement of two daughterboards above the motherboard. The figure shows the dual height bus connectors that couple the motherboard to the daughterboards along with the dual height card retainers that hold the daughterboards onto the bus connectors.

An illustration of the arrangement of daughterboards in the placement system of the present invention is provided by FIGS. 1 and 2. Shown in FIG. 1 are the motherboard 50, the back panel 16, a single height bus connector 10 and a double height bus connector 20. Single and double height bus connectors 10 and 20 together form dual height bus connectors and provide for a two-tier staggered arrangement of daughterboard connections to motherboard 50. In the preferred embodiment, there are three sets of dual height bus connectors 10 and 20 on motherboard 50. Referring briefly to FIG. 2, the two-tiered arrangement of daughterboards is illustrated.

Each daughterboard has a signal transfer end that electrically connects to the motherboard and a back panel connector end that couples to the back panel. In the preferred embodiment, all daughterboards are of equal length. A daughterboard may be "single wide," "double wide" or "triple wide." A single wide daughterboard has a width that spans one set of bus connectors A double wide daughterboard has a width that spans two sets of bus connectors, and a triple wide daughterboard has a width that spans three sets of bus connectors.

The preferred embodiment of the present invention can accommodate single wide, double wide, and triple wide daughterboards in many arrangements using three sets of dual height bus connectors. For example, six single wide daughterboards can be accommodated. Alternatively, two double wide daughterboards and two single wide daughterboards can be accommodated. The preferred embodiment can also accommodate two triple wide daughterboards.

Referring again to FIG. 1, back panel 16 is shown having a step-like shape to provide back panel coupling for both tiers of daughterboards. Back panel 16 also provides connector openings, such as connector opening 13, to accommodate accessory connectors that may be needed for the daughterboards. Back panel 16 has a lower portion 12 for coupling to the back panel connector end of lower tier daughterboards and an upper portion 14 for coupling to the back panel connector end of upper tier daughterboards.

Single height bus connector 10 and double height bus connector 20 are arranged in pairs, as shown in FIG. 1, to facilitate high speed data transfer between components on the motherboard and the daughterboards. Each single height bus connector 10 is equidistant from back panel portion 12 and each double height bus connector 20 is equidistant from back panel portion 14. With this arrangement of bus connectors 10 and 20, the signal traces of a high speed bus on motherboard 50 can be routed across the motherboard parallel to the back panel and in between the three sets of dual height bus connectors 10 and 20. With this routing, bus signals to both tiers of daughterboards leave motherboard 50 through bus connectors 10 and 20 at closely proximate points along the motherboard bus signal traces. This configuration minimizes the path length of the bus signals travelling between the motherboard and daughterboards, which in turn allows for high speed data transfer.

The signal transfer end of a lower tier daughterboard is connected to the motherboard through single height bus connector 10. Single height bus connector 10 provides for electrical connection between motherboard and lower tier daughterboard and prevents side to side movement of the lower tier daughterboard. The back panel connector end of a lower tier daughterboard is coupled to back panel lower portion 12. The coupling to back panel lower portion 12 may be a mechanical coupling to secure the lower tier daughterboard, or any commercially available accessory connector coupling to provide electrical connection to an external device.

In a similar manner, an upper tier daughterboard is connected to the motherboard through double height bus connector 20. Double height bus connector 20 provides for electrical coupling between the upper tier daughterboard and the motherboard while also preventing side to side movement of the upper tier daughterboard. The back panel connector end of the upper tier daughterboard is coupled to back panel upper portion 14. The coupling to back panel upper portion 14 may be a mechanical coupling to secure the upper tier daughterboard or an accessory connector coupling to provide electrical connection to an external device.

Referring now to FIG. 2, an arrangement of two single wide daughterboards is illustrated. Lower tier daughterboard 40 is electrically connected through single height bus connector 52 to motherboard 50. Upper tier daughterboard 30 is electrically connected to motherboard 50 through double height bus connector 54. Dual height card retainers are employed to prevent daughterboards from working lose from bus connectors during shipment. Dual height card retainer 60 prevents the signal transfer ends of lower and upper tier daughterboards 30 and 40 from moving vertically. In the preferred embodiment, there is one dual height card retainer positioned on each end of a dual height bus connector set.

Figure 3:
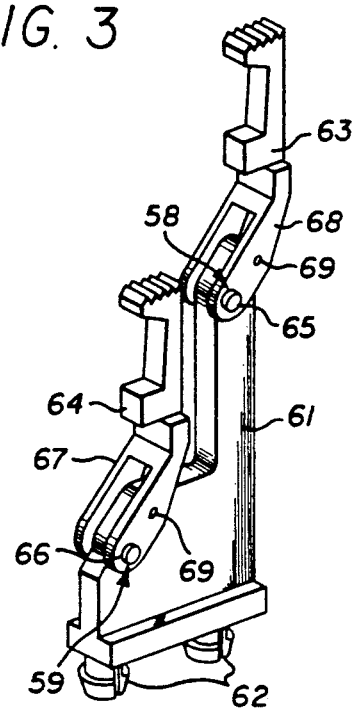
FIG. 3 provides a detailed illustration of a dual height card retainer.

FIG. 3 provides a more detailed view of a dual height card retainer 60. A pair of snaps 62 are used to couple the base of the card retainer to the motherboard. Base portion 61 is arranged in an L shape, and supports pivotable lower support arm 67 and upper support arm 68. Lower arm 67 is coupled to the horizontal portion of base portion 61 via a pair of horizontally opposed studs 66 received into pivot holes 59. A grip 64 on lower arm 67 is used to limit upward movement of the lower tier daughterboard. The card retainer 60 also has an upper arm 68 which is coupled to the vertical portion of the base via a second pair of horizontally opposed studs 65 received into pivot holes 58. Upper arm 68 has a grip 63 which is used to limit the upward movement of the upper tier daughterboard. Lower arm 67 and upper arm 68 are capable of maintaining a vertical position by means of small nubs 69 on base portion 61 which fit in respective holes in the arms to lock the arms into a vertical position.

The daughterboards are prevented from moving vertically when the respective card retainer arms 67 and 68 are in a vertical position. Both lower arm 67 and upper arm 68 can be rotated around their pivot points to a retracted position to allow removal of the daughterboards. The pivot holes 58 and 59 are located foreward of the grips 63 and 64, respectively. As a consequence, the greater the vertical upward force applied to a daughterboard, the greater the gripping force provided by the dual height card retainer 60.

Figure 4A:
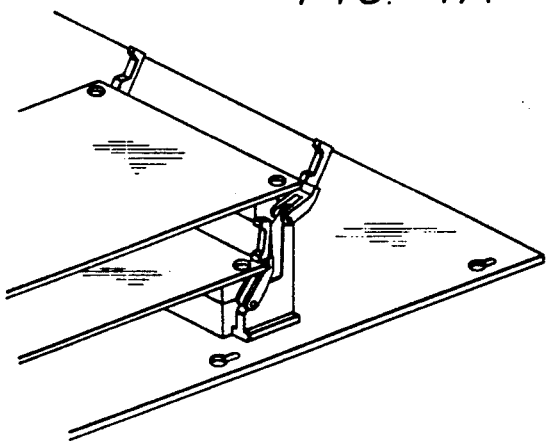
FIGS. 4a-4c illustrate the operation of the dual height card retainers for installation and removal of daughterboards.
Figure 4B:
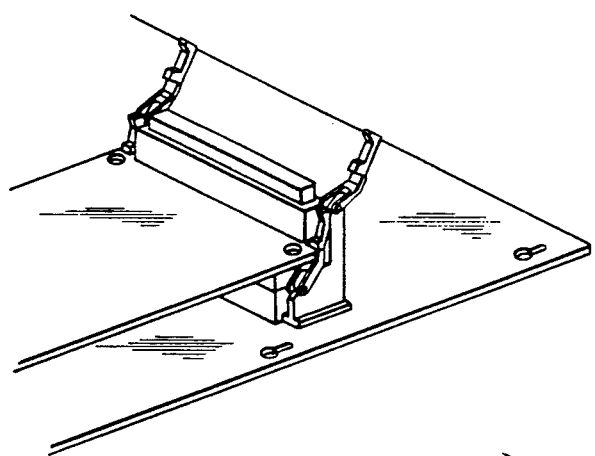
Figure 4C:
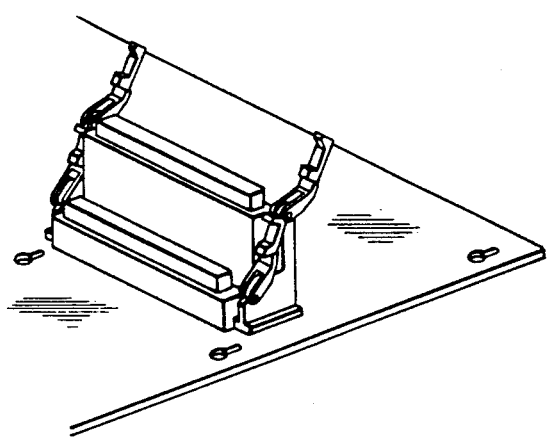

The operation of card retainers for installation or removal of the daughterboards is illustrated in FIGS. 4a–4c. FIG. 4a shows the upper arms of the card retainers rotated to a retracted position which allows for removal of the upper tier daughterboard. The lower tier daughterboard can remain vertically locked while removing the upper tier daughterboard. FIG. 4b shows the upper tier daughterboard removed from the double height connector, and the lower arms of the card retainers retracted to allow for removal of the lower tier daughterboard. FIG. 4c shows both upper tier and lower tier daughterboards removed, and the upper and lower arms of the card retainers retracted to allow for installation of new daughterboards. As will be appreciated, the card retainers require no special tools to operate, retainer arms 67 and 68 being retracted and engaged by simple fingertip pressure.

Referring again to FIGS. 1 and 2, back panel 16 in the preferred embodiment provides six accessory connector openings, such as connector opening 13, for use by the daughterboards. Accessory connectors 35 and 45 of daughterboards 30 and 40 are mechanically coupled to accessory connector openings in the back panel 16. Accessory connector 35 couples to its corresponding accessory connector opening in back panel upper portion 14, thereby securing the upper tier daughterboard 30 and providing electrical connection between the upper tier daughterboard 30 and an external device. Similarly, accessory connector 45 couples to its corresponding accessory connector opening in back panel lower portion 12, thereby securing the lower tier daughterboard 40 and providing electrical connection to an external device.

Daughterboards that do not need accessory connectors or back panels still need to be secured to the back panel. Moreover, when daughterboard positions are empty their corresponding accessory connector openings in the back panel must be covered to prevent excessive emission of electromagnetic radiation.

An example filler panel 70 that is consistent with the teachings of the present invention is illustrated in FIGS. 5 and 6. Referring to FIG. 5, the filler panel 70 is composed of two parts: a filler portion 71 and an insert portion 73. Filler portion 71 has sufficient area to cover one of the accessory connector openings in the back panel. FIG. 6 shows a top view of filler panel 70. Filler portion 71 is shown having a pair of landings 72 which are used to mechanically couple to the back panel connector end of a daughterboard. The insert portion has a pair of snaps 74 that project through holes 76 in filler portion 71. Snaps 74 are used to secure the filler portion to an accessory connector opening in the back panel. Insert portion 73 has a pair of flexible surfaces 75 which are used to secure the daughterboard to landings 72. The filler panel covers the accessory connector opening to provide electromagnetic interference shielding, while at the same time providing mechanical coupling between a daughterboard and the back panel 16.

Referring now to FIG. 7, a multi-purpose circuit card handle 80 is illustrated. Circuit card handle 80 is employed to provide for easy installation and removal of daughterboards from their corresponding bus connectors 10 or 20 in a crowded computer housing. The circuit card handle 80 has a lower portion 87 that couples to a daughterboard such as daughterboard 85 using a pair of snaps 82. A daughterboard can be simply installed by pushing on the lower portion 87 of circuit card handle 80, and removed by pulling on lower portion 87. The lower portion 87 of card handle 80 remains coupled to the daughterboard during normal operation of the system. Lower portion 87 has a sufficiently low profile such that when it is attached to a lower tier daughterboard there is sufficient clearance to position an upper tier daughterboard.

The multi-purpose circuit card handle 80 can also serve to positively locate daughterboards in systems that have only one tier of daughterboards. The circuit card handle 80 has an optional upper portion 86 that can be attached to the lower portion 87 by sliding L-shaped tabs 88 into complementary L-shaped slots 89. FIG. 8 shows the optional upper portion 86 and the lower portion 87 of the multi-purpose circuit card handle coupled in order to function as a card retainer. In this configuration, the top of the computer housing when lowered into its closed position presses against upper portion 86 and prevents the upper portion 86 of the circuit card handle 80 from moving vertically, thereby holding the daughterboard onto the bus connector.

While the present invention has been described in terms of a current embodiment, those skilled in the art will recognize that the invention is not limited to the embodiment described. The method and apparatus of the present invention can be practiced with modification and alteration within the spirit and scope of the appended claims. The description is thus to be regarded as illustrative instead of restrictive on the present invention.

What is claimed is:

1. A card retainer for retaining a plurality of circuit boards disposed in a multi-tiered staggered arrangement above and parallel to a main circuit board and coupled to connectors coupled to said main circuit board, said card retainer comprising:
   an L-shaped base coupled to said main circuit board comprising a horizontal member and a vertical member; and
   a plurality of retaining arms pivotally coupled to said base for retaining said circuit boards by preventing said circuit boards from detaching from said connectors.

2. The card retainer as set forth in claim 1, wherein said base further comprises mechanical attachment means for removably attaching said retainer to said main circuit board.

3. The card retainer as set forth claim 2, wherein said mechanical attachment means comprises deflective tangs having spurs and engaging cooperating openings in said main circuit board.

4. The card retainer as set forth in claim 1 further comprising detent means for holding said retaining arms in a first vertical position to prevent said circuit boards from moving vertically, said detent means further permitting said retaining arms to pivot in a first dimension from said first vertical position to a second retracted position to allow said circuit boards to be installed and removed.

5. The card retainer as set forth in claim 4, wherein said detent means comprises:
   a plurality of pairs of nubs projecting perpendicularly from said base in a second dimension substantially perpendicular to said first dimension;
   a plurality of pairs of holes disposed in said retaining arms for cooperatively engaging said nubs when said retaining arms are in said first vertical position.

6. The card retainer as set forth in claim 5, wherein said retaining arms further comprise:
   a body; and
   a pair of elongated members extending from said body and having a pair of circular holes for pivotally receiving a pair of circular pivots disposed on said base of said card retainer, said elongated members when coupled to said base flexing in said second dimension and being displaced so as to permit said elongated members to pass over said nubs when said retaining arms are pivoted from said first vertical position by pressing on said body.

7. The card retainer as set forth in claim 4, wherein said retaining arms further comprise vertical movement limiting means for preventing said circuit boards from moving vertically out of said connectors and disconnecting from said main circuit board when said retaining arms are disposed in said first vertical position.

8. A card retainer for retaining a first circuit board and a second circuit board onto connectors coupled to a main circuit board, said first and second circuit boards having a two-tier staggered arrangement above and parallel to said main circuit board, the card retainer comprising:
   an L-shaped base comprising a horizontal member and a vertical member;
   means for mechanically coupling said horizontal member of said base to said main circuit board;
   a lower retaining arm rotatably coupled to said horizontal member and able to pivot between an upright position and a retracted position, said lower arm comprising means to hold it in an upright position and having a first grip to prevent said first circuit board from moving vertically; and
   an upper retaining arm rotatably coupled to said vertical member and able to pivot between an upright position and a retracted position, said upper arm comprising means to hold it in an upright position and having a second grip to prevent said second circuit board from moving vertically.

9. The card retainer as set forth in claim 8, wherein said means for mechanically coupling said horizontal member of said base to said main circuit board comprises deflective tangs having spurs and engaging cooperating openings in said main circuit board.

10. The card retainer as set forth in claim 9, wherein said means for holding said lower and upper retaining arms in said vertical positions to prevent said first and said second circuit boards from moving vertically comprises detent means, said detent means further permitting said retaining arms to pivot in a first dimension from said first vertical position to a second retracted position to allow said first and said second circuit boards to be installed and removed.

11. The card retainer as set forth in claim 10, wherein said detent means comprises:
    a plurality of pairs of nubs projecting perpendicularly from said base in a second dimension substantially perpendicular to said first dimension;
    a plurality of pairs of holes disposed in said lower and upper retaining arms for cooperatively engaging said nubs when said lower and upper retaining arms are in said first vertical position.

12. The card retainer as set forth in claim 11, wherein said lower and upper retaining arms further comprise:
    a body; and
    a pair of elongated members extending from said body and having a pair of circular holes for pivotally receiving a pair of circular pivots disposed on said base of said card retainer, said elongated members when coupled to said base flexing in said second dimension and being displaced so as to permit said elongated members to pass over said nubs when said lower and upper retaining arms are pivoted from said first vertical position by pressing against said body.

13. The card retainer as set forth in claim 12, wherein said lower and upper retaining arms further comprise vertical movement limiting means for preventing said first and second circuit boards from moving vertically out of said connectors and disconnecting from said main circuit board when said lower and upper retaining arms are disposed in said first vertical position.

14. A method for retaining a plurality of circuit boards disposed in a multi-tiered staggered arrangement above and parallel to a main circuit board and coupled to connectors coupled to said main circuit board, said method comprising the steps of:
   providing an L-shaped base coupled to said main circuit board comprising a horizontal member and a vertical member; and
   pivotally coupling a plurality of retaining arms to said base for retaining said circuit boards by preventing said circuit boards from detaching from said connectors.

15. The method according to claim 14, wherein providing said base further comprises providing mechanical attachment means for removably attaching said base to said main circuit board.

16. The method as set forth in claim 15, wherein providing said mechanical attachment means comprises providing deflective tangs having spurs and engaging cooperating openings in said main circuit board.

17. The method as set forth in claim 15 further comprising using detent means for holding said retaining arms in a first vertical position to prevent said circuit boards from moving vertically, using said detent means further for permitting said retaining arms to pivot in a first dimension from said first vertical position to a second retracted position to allow said circuit boards to be installed and removed.

18. The method according to claim 17, wherein said using detent means comprises:
   providing a plurality of pairs of nubs projecting perpendicularly from said base in a second dimension substantially perpendicular to said first dimension; and
   providing a plurality of pairs of holes disposed in said retaining arms for cooperatively engaging said nubs when said retaining arms are in said first vertical position.

19. The method according to claim 18, wherein said providing said retaining arms further comprises:
   providing a pair of elongated members extending from a body and having a pair of circular holes for pivotally receiving a pair of circular pivots disposed on said base;
   flexing and displacing said elongated members in said second dimension to permit said elongated members to pass over said nubs when said retaining arms are pivoted from said first vertical position by pressing on said body; and
   providing vertical movement limiting means for preventing said circuit cards from moving vertically out of said connectors and disconnecting from said main circuit board when said retaining arms are disposed in said first vertical position.

* * * * *